United States Patent
Tseng et al.

(10) Patent No.: US 6,413,840 B1
(45) Date of Patent: Jul. 2, 2002

(54) METHOD OF GETTERING LAYER FOR IMPROVING CHEMICAL-MECHANICAL POLISHING PROCESS IN FLASH MEMORY PRODUCTION AND SEMICONDUCTOR STRUCTURE THEREOF

(75) Inventors: Uway Tseng, Tai-Chung Hsien; Kent Kuohua Chang, Taipei; Wen-Pin Lu, Yi-Lan, all of (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 09/821,165

(22) Filed: Mar. 28, 2001

(51) Int. Cl.[7] .................. H01L 21/322; H01L 29/788
(52) U.S. Cl. ........................... 438/476; 257/315
(58) Field of Search .................. 438/142, 143, 438/211, 257, 264, 471, 476, 507, 692; 257/314, 315, 316, 318, 321, 390

(56) References Cited

U.S. PATENT DOCUMENTS

| 5,502,321 A | * | 3/1996 | Matsushita |
| 6,080,639 A | * | 6/2000 | Huang et al. |
| 6,252,294 B1 | * | 6/2001 | Hattori et al. |
| 2001/0019867 A1 | * | 9/2001 | Kawata et al. |
| 2002/0001898 A1 | * | 1/2002 | Park et al. |

* cited by examiner

Primary Examiner—Keith Christianson

(57) ABSTRACT

A method of gettering layer for improving chemical mechanical polishing process in flash-memory production is provided to protect a memory element against baking and keep its reliability by blockading mobile electrons with the gettering layer. Moreover, by taking advantage of the gettering layer, reduction of the thickness of the ILD for increasing the etching margin, the deposition margin, and the remaining margin of oxides are made possible.

18 Claims, 8 Drawing Sheets

METHOD OF GETTERING LAYER FOR IMPROVING CHEMICAL-MECHANICAL POLISHING PROCESS IN FLASH MEMORY PRODUCTION AND SEMICONDUCTOR STRUCTURE THEREOF

FIELD OF THE INVENTION

This invention relates to a method of gettering layer that can remove impurities or eliminate imperfections of element so as to improve chemical mechanical polishing process during flash-memory production.

BACKGROUND OF THE INVENTION

The widely implemented nonvolatile memory may be divided into the categories including: read only memory (ROM), erasable programmable read only memory (EPROM), electrically erasable programmable read only memory (EEPROM), and flash memory.

The low-price masked ROM is considered more profitable for mass production on the one hand, however, a vital loss beyond compensation might be resulted in the case of errors made in program or data on the other hand.

On the contrary, the high-cost EPROM can be programmed and erased repeatedly usually in some ten times, therefore, it would rather be fit for a small quantity production.

Programming or erasing of the EEPROM and flash memory can be performed by controlling charge or discharge of the gate. Efforts have been continuously made on the nonvolatile memory trying for further shortening the programming and the erasing time, lowering the working voltage and the device measurements, and lengthening the data preservable time.

The floating gate voltage (Vt) of the flash memory will drop down rapidly when it is baked around 250° C. because of the electrically combination of electrons and holes in the floating gate. As illustrated in FIG. 1, a conventional intermediate layer dielectric (ILD) of boron phosphor silicate glass (BPSG) is implemented for covering an element and serving as a gettering layer or a trapping layer so as to resist against moisture or catch mobile ions, wherein, for increasing flattening margin, the thickness of the ILD is determined subject to the pattern density so that the Vt may be affected after baking.

SUMMARY OF THE INVENTION

In order to improve the degraded reliability of a flash memory after baking, also the dielectrics of an intermediate layer dielectric (ILD) when flattening the margin of the dielectrics with chemical mechanical polishing (CMP), and enlargement of thickness margin of peripheral ILD and dense array, a method of gettering layer for improving chemical mechanical polishing process in flash-memory production is provided to protect a memory element against baking and keep its reliability by blockading mobile ion with the gettering layer. Moreover, by taking advantage of the gettering layer, reduction of the thickness of the ILD for increasing the etching margin, the deposition margin, and the remaining margin of oxides are made possible.

For realizing abovesaid objects, the method of gettering layer for improving chemical mechanical polishing process in flash-memory production comprises:

providing a substrate, whereon at least a memory structure layer is disposed;

depositing a first dielectric layer, which is formed lying on the memory structure layer;

depositing a gettering layer, which is formed lying on the first dielectric layer;

forming a second dielectric layer lying on the gettering layer; and flattening the second dielectric layer with a chemical mechanical polisher.

For more detailed information regarding this invention together with advantages or features thereof, at least an example of preferred embodiment will be elucidated below with reference to the annexed drawings.

BRIEF DESCRIPTION OF THE DRAWINGS

The related drawings in connection with the detailed description of this invention, which is to be made later, are described briefly as follows, in which.

DETAILED DESCRIPTION OF THE PREFERRED EMBODIMENT

Figure 1:
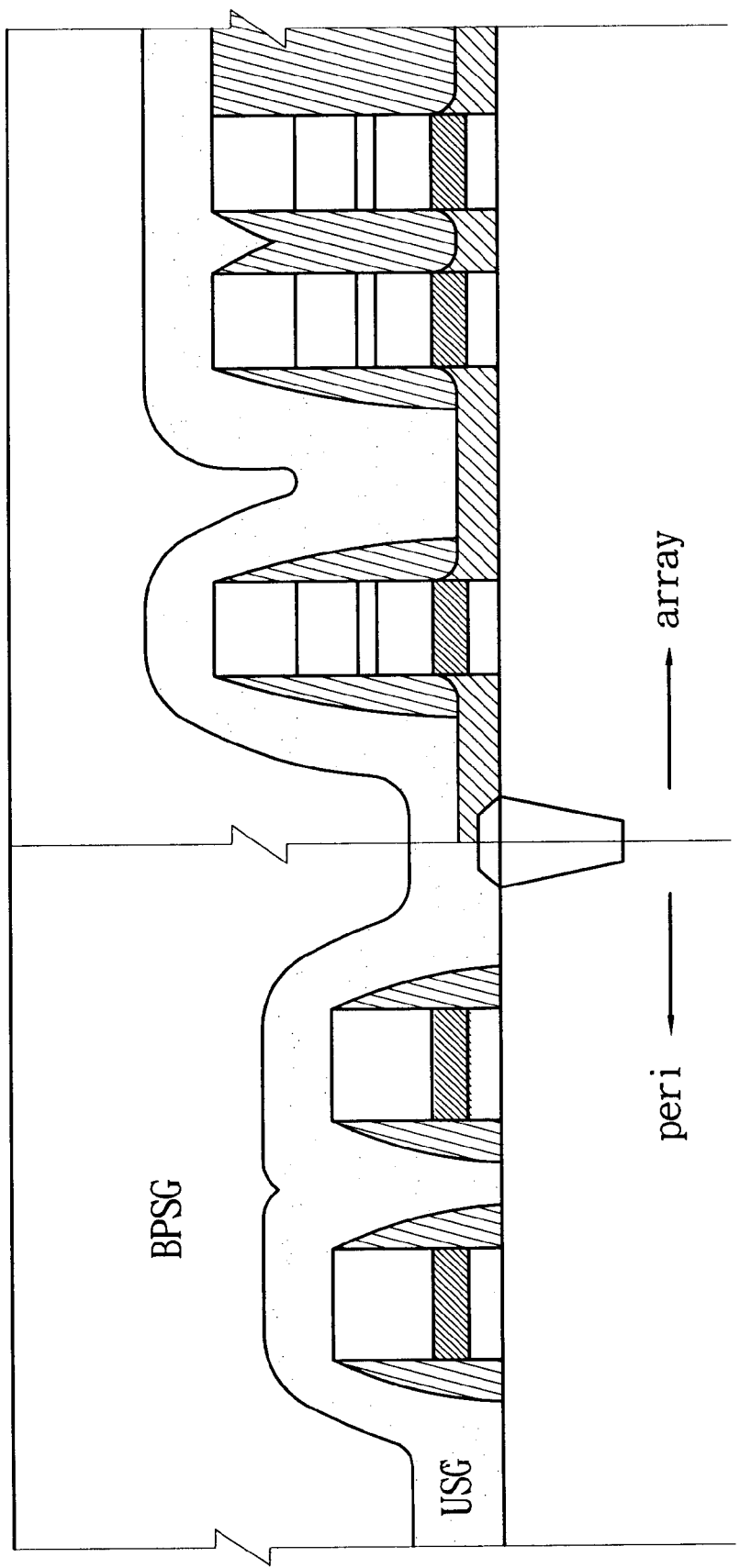
FIG. 1 shows a conventional intermediate layer dielectric structure.
Figure 2A:
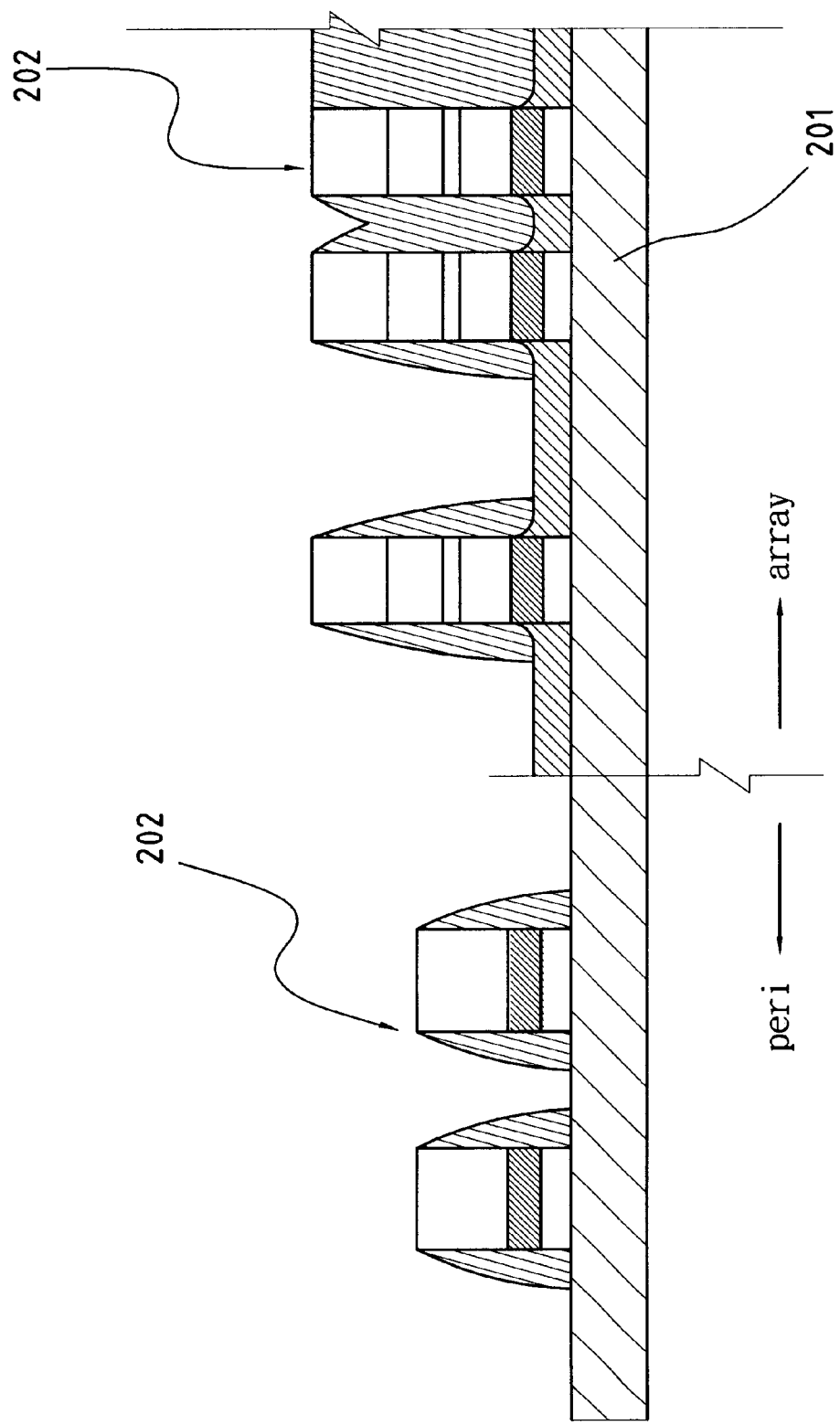
FIGS. 2(A) through 2(E) are schematic diagrams showing a method of gettering layer for improving chemical mechanical polishing process in flash-memory production.
Figure 2B:
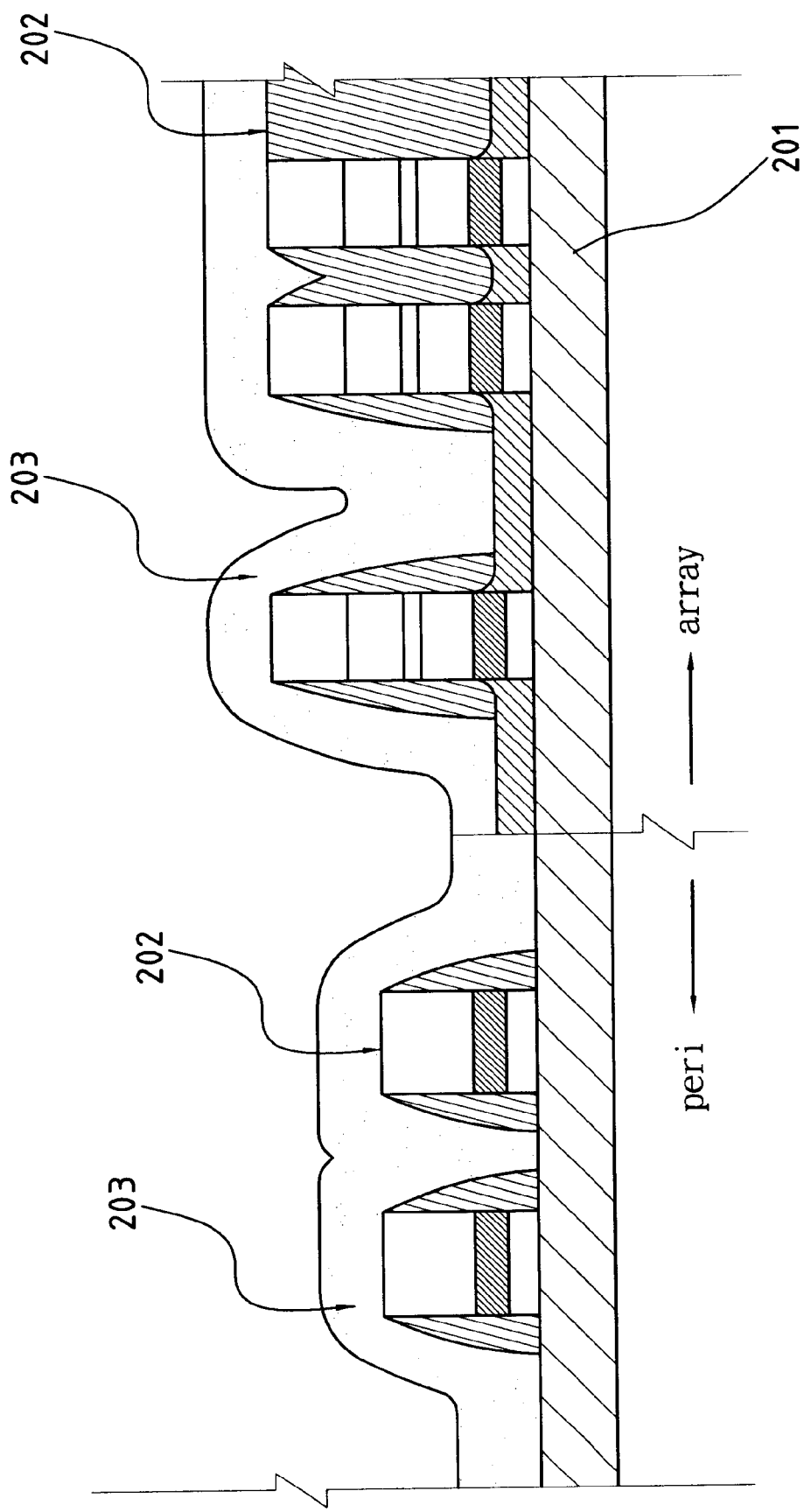
Figure 2C:
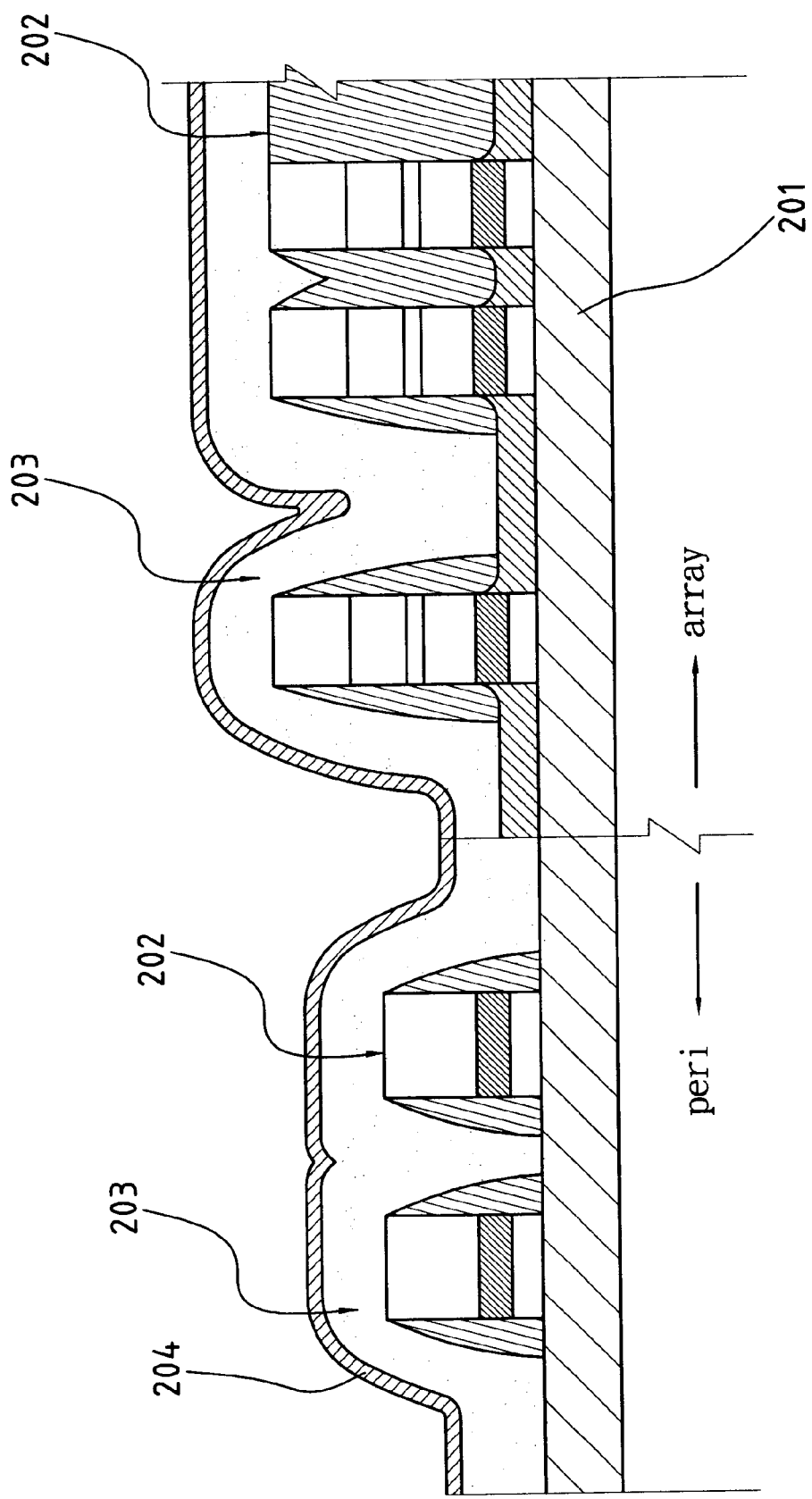
Figure 2D:
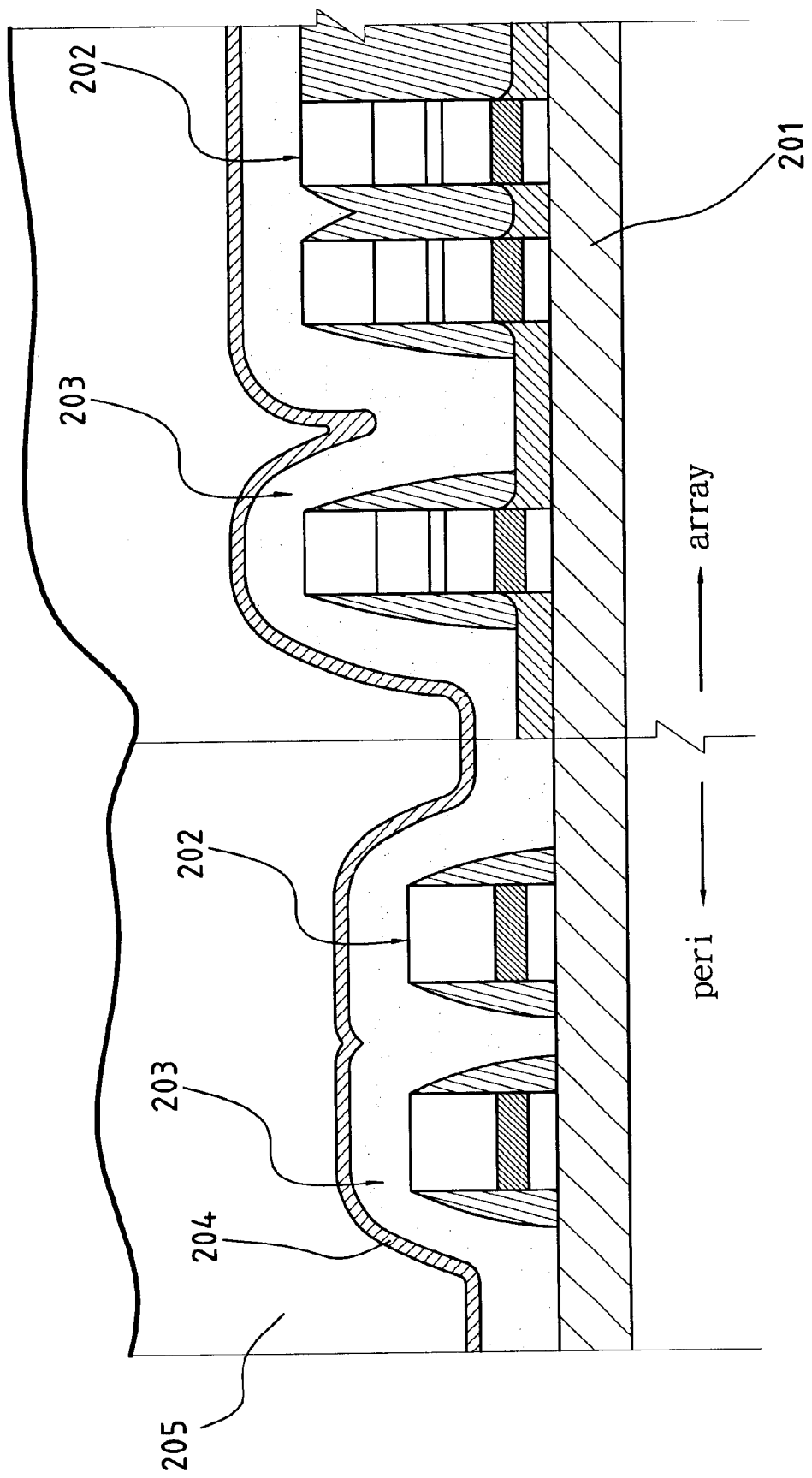
Figure 2E:
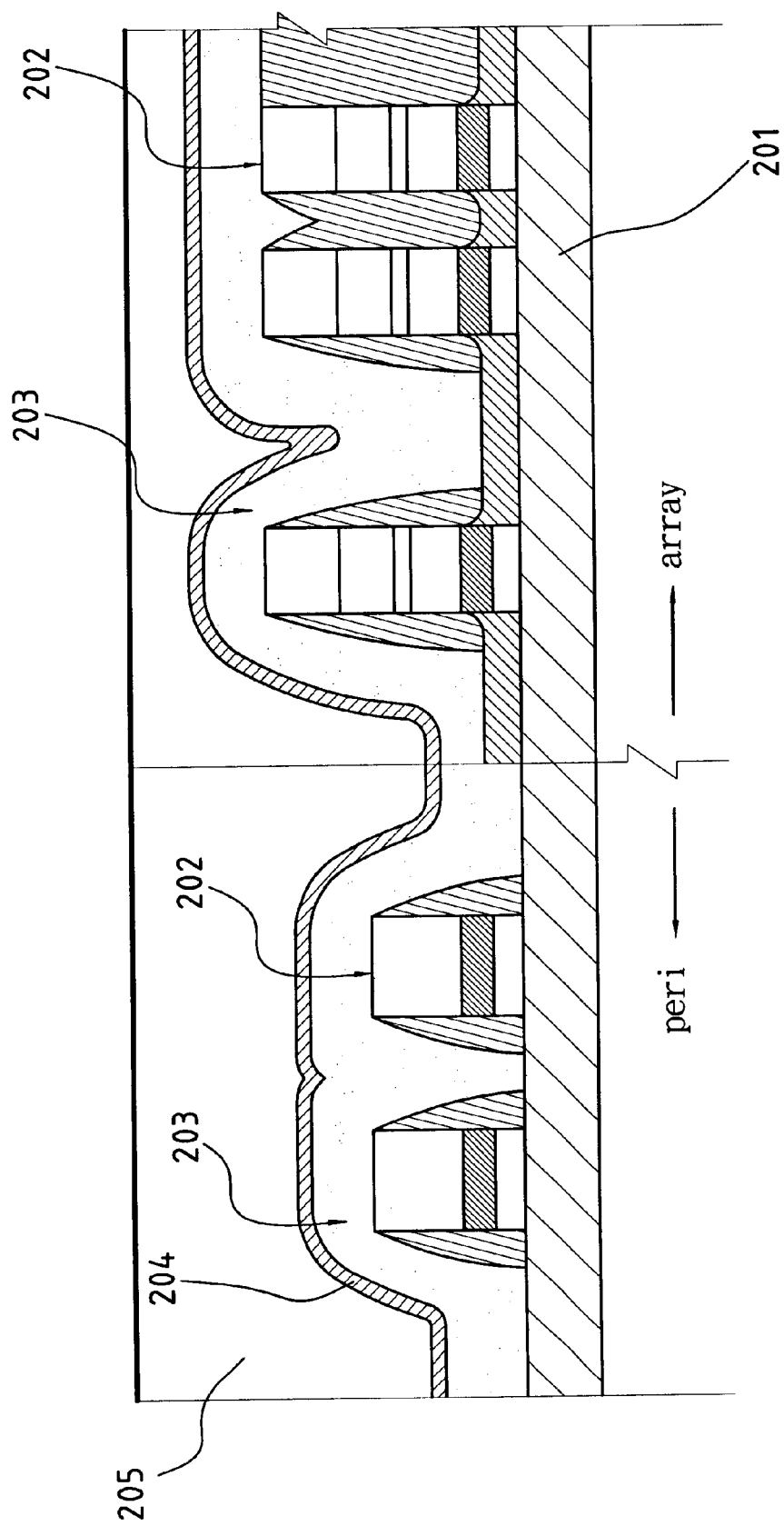

A method of gettering layer for improving chemical mechanical polishing (CMP) process in flash-memory production comprises:

providing a substrate 201 shown in FIG. 2(A), whereon at least a memory structure layer 202 of AND, OR, or NAND gate element is disposed;

depositing a first dielectric layer 203 shown in FIG. 2(B), which is formed lying on the memory structure layer 202, and the material thereof may be undoped silicate glass (USG) or dielectrics otherwise;

depositing a gettering layer 204 shown in FIG. 2(C), which is formed lying on the first dielectric layer 203 to enhance the reliability of the memory structure layer 202, wherein the material of the gettering layer is an N—O—Si compound ($SiO_xN_y$) formed by way of chemical vapor deposition (CVD) under conditions of: 300~500° C., 4~7 torr, and 100~140W. When the thickness of the $SiO_xN_y$ is 100~1000 Å and the DUV is 248 Å, the value RI and K of the $SiO_xN_y$ are found located between 1.9~2.5 and 0.4~0.7 respectively;

forming a second dielectric layer 205 shown in FIG. 2(D) lying on the gettering layer 204, wherein the second dielectric layer 205 may be phosphor silicate glass (PSG), boron phosphor silicate glass (BPSG), or dielectrics otherwise; and flattening the second dielectric layer 205 shown in FIG. 2(E) with a chemical mechanical polisher.

The intermediate gettering layer 204 between the dielectric layer of the USG 203 and BPSG 205 is arranged to blockade mobile ion so as to keep the reliability of the flash memory after baking. Moreover, as the $SiO_xN_y$ layer is an excellent dielectric layer, reduction of the thickness of an intermediate layer dielectric (ILD) is possible for enlarging the margin of etching or grinding thereof and for improvement of the chemical mechanical polishing process applied to the ILD.

Figure 3A:
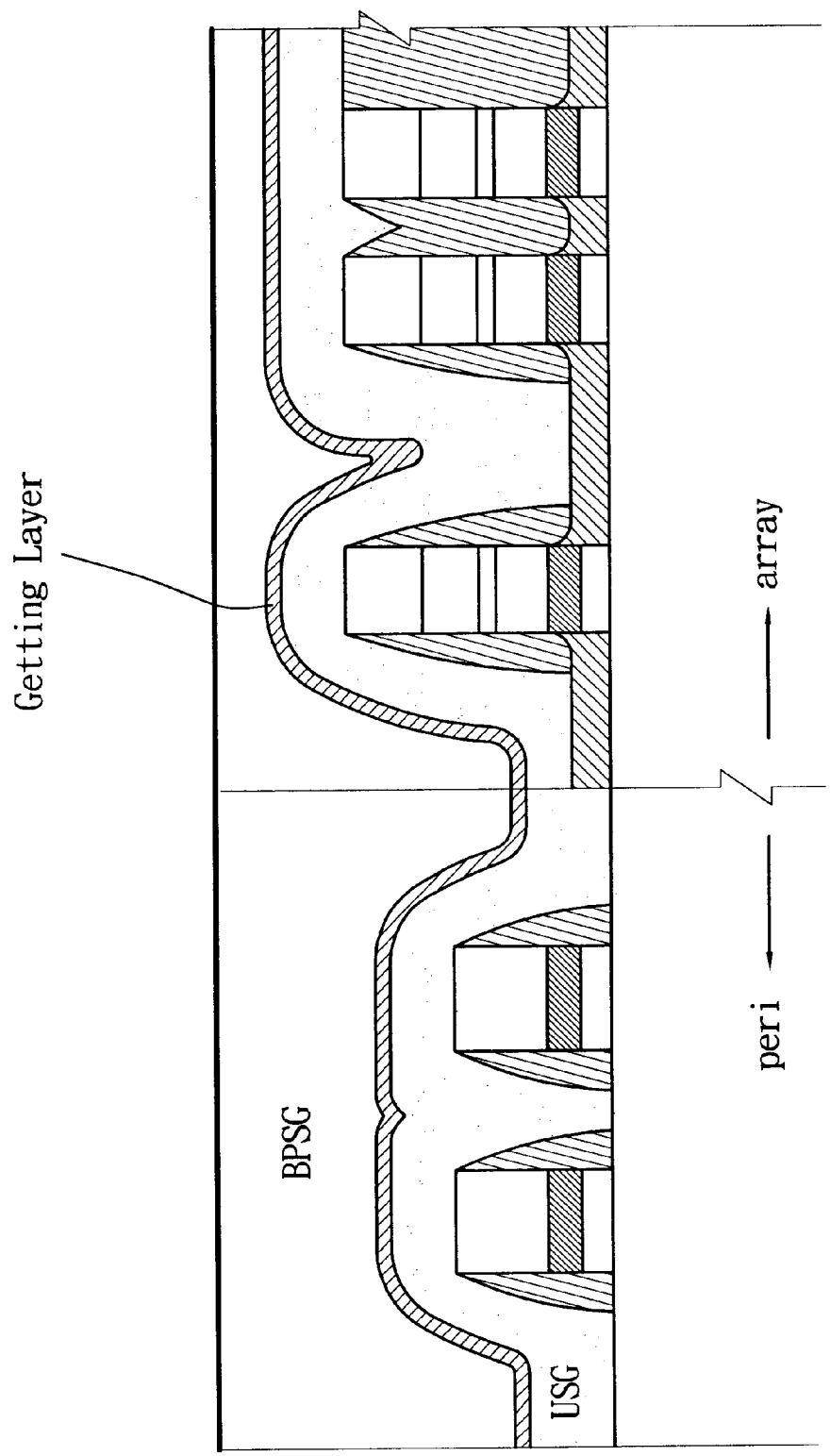
FIG. 3(A) shows a memory structure established according to an embodiment of this invention.
Figure 3B:
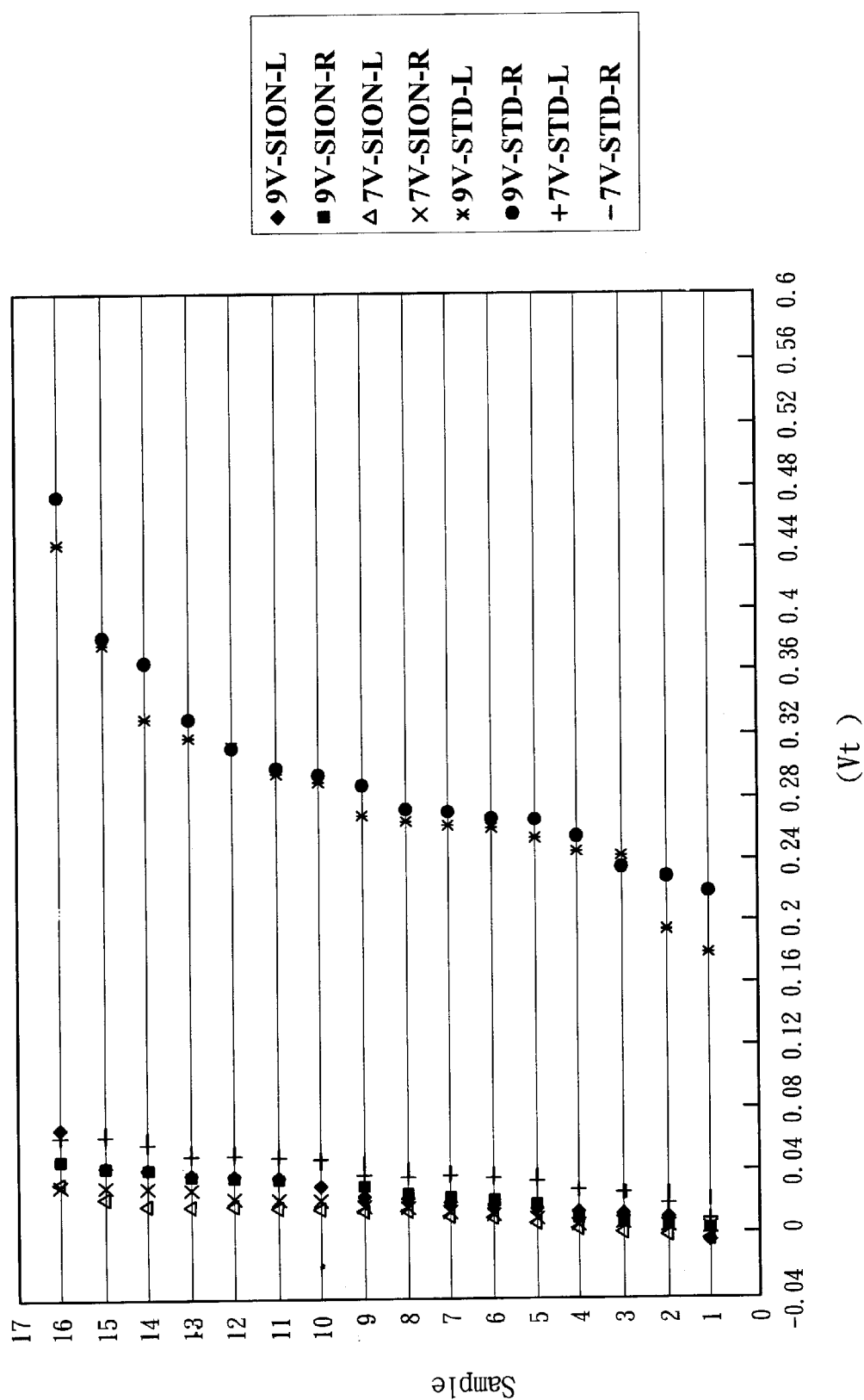
FIG. 3(B) indicates a plotted curve of test data of a memory element according to this invention and that of a conventional one respectively for comparison.

FIG. 3(A) shows a memory structure according to this invention including a low-density peripheral structure on the left and a high-density array structure on the right. FIG. 3(B) indicates a plotted curve of test data of a memory element according to this invention and that of a conventional one respectively for comparison, wherein:

SION-L and SION-R are test data of twin-cell element according to this invention when programmed at 9V or 7V and baked at 250° C. through 168 hours; and STD-L and STD-R are test data of a conventional twin-cell element.

From the above, it is obvious that the element's floating gate voltage (Vt) of this invention may be changed in the range between 0.018~0.06V when programmed at 9V or 7V, far below than 0.18V (up) of the conventional process when programmed at 9V, and such effect is more conspicuous when the programming voltage is higher.

In the above described, at least one preferred embodiment has been described in detail with reference to the drawings annexed, and it is apparent that numerous variations or modifications may be made without departing from the true spirit and scope thereof, as set forth in the claims below.

What is claimed is:

1. A method of gettering layer for improving chemical mechanical polishing process in flash-memory production, comprising:

providing a substrate, whereon at least a memory structure layer is disposed;

depositing a first dielectric layer, which is formed lying on the memory structure layer;

depositing a gettering layer, which is formed lying on the first dielectric layer;

forming a second dielectric layer lying on the gettering layer; and flattening the second dielectric layer with a chemical mechanical polisher.

2. The method according to claim 1, wherein the first dielectric layer is made of undoped silicate glass (USG) or dielectrics otherwise.

3. The method according to claim 1, wherein the gettering layer is made of an N—O—Si compound ($SiO_xN_y$).

4. The method according to claim 3, wherein the RI value of the N—O—Si compound ($SiO_xN_y$) is about 1.9~2.5 when DUV is 248 Å (ang).

5. The method according to claim 3, wherein the K value of the N—O—Si compound ($SiO_xN_y$) is about 0.4~0.7 when DUV is 248 Å.

6. The method according to claim 3, wherein the thickness of the N—O—Si compound ($SiO_xN_y$) is about 100~1000 Å.

7. The method according to claim 3, wherein the N—O—Si compound ($SiO_xN_y$) is formed by way of chemical vapor deposition (CVD).

8. The method according to claim 3, wherein the deposited N—O—Si compound ($SiO_xN_y$) is formed under conditions of: 300~500° C., 4~7 torr, and 100~140W.

9. The method according to claim 1, wherein the second dielectric layer is phosphor silicate glass (PSG), boron phosphor silicate glass (BPSG), or dielectrics otherwise.

10. A semiconductor structure based on the method according to claim 1, comprising:

a substrate having at least a memory structure layer disposed thereon;

a first dielectric layer, which is formed lying on the memory structure layer;

a gettering layer, which is formed lying on the first dielectric layer; and a second dielectric layer lying on the gettering layer and flattened with a chemical mechanical polisher.

11. The semiconductor structure according to claim 10, wherein the first dielectric layer is made of undoped silicate glass (USG) or dielectrics otherwise.

12. The semiconductor structure according to claim 10, wherein the gettering layer is made of an N—O—Si compound ($SiO_xN_y$).

13. The semiconductor structure according to claim 12, wherein the RI value of the N—O—Si compound ($SiO_xN_y$) is about 1.9~2.5 when DUV is 248 Å (ang).

14. The semiconductor structure according to claim 12, wherein the K value of the N—O—Si compound ($SiO_xN_y$) is about 0.4~0.7 when DUV is 248 Å.

15. The semiconductor structure according to claim 12, wherein the thickness of the N—O—Si compound ($SiO_xN_y$) of the gettering layer is about 100~1000 Å.

16. The semiconductor structure according to claim 12, wherein the N—O—Si compound ($SiO_xN_y$) of the gettering layer is formed by way of chemical vapor deposition (CVD).

17. The semiconductor structure according to claim 12, wherein the deposited N—O—Si compound ($SiO_xN_y$) is formed under conditions of: 300~500° C., 4~7 torr, and 100~140W.

18. The semiconductor structure according to claim 10, wherein the second dielectric layer is phosphor silicate glass (PSG), boron phosphor silicate glass (BPSG), or dielectrics otherwise.

* * * * *